United States Patent [19]

Cavers

[11] Patent Number: 5,049,832
[45] Date of Patent: Sep. 17, 1991

[54] AMPLIFIER LINEARIZATION BY ADAPTIVE PREDISTORTION

[75] Inventor: James K. Cavers, Richmond, Canada

[73] Assignee: Simon Fraser University, Burnaby, Canada

[21] Appl. No.: 511,722

[22] Filed: Apr. 20, 1990

[51] Int. Cl.$^5$ .............................................. H03F 1/26
[52] U.S. Cl. .................................... 330/149; 332/160
[58] Field of Search ................ 328/162, 166; 330/149, 330/151; 332/159, 160; 375/60

[56] References Cited

U.S. PATENT DOCUMENTS

| | | |
|---|---|---|
| 4,291,277 | 9/1981 | Davis et al. |
| 4,412,337 | 10/1983 | Bickley et al. |
| 4,462,001 | 7/1984 | Girard |
| 4,554,514 | 11/1985 | Whartenby et al. ............ 332/160 X |
| 4,700,151 | 10/1987 | Nagata |

OTHER PUBLICATIONS

Y. Akaiwa and Y. Nagata, "Highly Efficient Digital Mobile Communications with a Linear Modulation Method", IEEE J. Sel. Areas in Comms., vol. SAC-5, No. 5, pp. 890–895, Jun. 1987.

A. Bateman, D. M. Haines and R. J. Wilkinson, "Linear Transceiver Architectures", Proc. IEEE Vehic. Tech. Conf., pp. 478–484, Philadelphia, 1988.

S. Ono, N. Kondoh and Y. Shimazaki, "Digital Cellular System with Linear Modulation", Proc. IEEE Vehic. Tech. Conf., pp. 44–49, San Francisco, 1989.

M. Nannicini, P. Magni, and F. Oggioni, "Temperature Controlled Predistortion Circuits for 64 QAM Microwave Power Amplifiers", IEEE MTT-S Digest, pp. 99–102, 1985.

J. Namiki, "An Automatically Controlled Predistorter for Multilevel Quadrature Amplitude Modulation", IEEE Trans. Comm., vol. COM-31, No. 5, pp. 707–712, May 1983.

H. Girard and K. Feher, "A New Baseband Linearizer for More Efficient Utilization of Earth Station Amplifiers Used for QPSK Transmission", IEEE J. Selected Areas in Commun., vol. SAC-1, No. 1, pp. 46–56, Jan. 1983.

J. Graboski and R. C. Davis, "An Experimental MQAM Modem Using Amplifier Linearization and Baseband Equalization Techniques", Proc. Natl. Commun. Conf., pp. E3.2.1–E3.2.6, 1982.

A. A. M. Saleh and J. Salz, "Adaptive Linearization of Power Amplifiers in Digital Radio Systems", Bell Syst. Tech. J., vol. 62, No. 4, pp. 1019–1033, Apr. 1983.

Y. Nagata, "Linear Amplification Technique for Digital Mobile Communications", Proc. IEEE Vehic. Tech. Conf., pp. 159–164, San Francisco, 1989.

Primary Examiner—Steven Mottola
Attorney, Agent, or Firm—Barrigar & Oyen

[57] ABSTRACT

A method of linearizing an amplifier to produce an amplified output sample $v_a$ in response to a predistorted input sample $v_d$ derived from an input modulation sample $v_m$, such that $v_a \approx K v_m$, where K is the amplifier's desired constant amplitude gain. The squared magnitude $x_m$ of the input modulation sample $v_m$ is first derived. A table entry $F_i$ is then selected from a table containing $N_t$ values $F_i$ where $i = 0, 1, \ldots N_t - 1$. Each table entry corresponds to a squared magnitude value $x_{mi}$; and, for each table entry, $F_i G(x_{mi}|F_i|^2) \approx K$, where $G(x)$ is the complex gain of the amplifier. The table entry selected is the one for which the absolute value $|x_m - x_{mi}|$ is minimized with respect to the table index i. The predistorted sample $v_d$ is then derived, in rectangular coordinates, as $v_d = v_m F_i$, viz:

$$Re(v_d) = Re(v_m)Re(F_i) - Im(V_m)Im(F_i)$$

$$Im(v_d) = Re(v_m)Im(F_i) + Im(V_m)Re(F_i)$$

where Re(x) is the real component of x and Im(x) is the imaginary component of x.

8 Claims, 9 Drawing Sheets

AMPLIFIER LINEARIZATION BY ADAPTIVE PREDISTORTION

FIELD OF THE INVENTION

This application pertains to a method of adaptively predistorting a power amplifier to linearize the amplifier.

BACKGROUND OF THE INVENTION

Mobile communications systems, such as those used for cellular telephone communication, divide the available frequency spectrum into a multiplicity of individual signalling channels or frequency bands. Particular channels are allocated to individual users as they access the system. Each user's communications are routed by the system through the channel allocated to that user. Signals broadcast by the system must be carefully regulated so that they remain within the channels allocated to the various users. "Out-of-band" signals can spill over from one channel to another, causing unacceptable interference with communications in the other channels.

To date, mobile communications systems have generally employed frequency modulation ("FM") techniques which do not require variation of the amplitude of the transmitted signal. Thus, the frequency of the transmitted signal carrier changes, but the signal power level remains constant. Such systems have sufficed for voice communications. However, there is an increasing desire to expand the capabilities of mobile communications systems to encompass data as well as voice communications. Commercially worthwhile data transfer rates require the use of modulation techniques which are more spectrally efficient than the FM techniques used for voice communication. This necessitates the use of amplitude modulation techniques which in turn require linearized modulation.

The electronic amplifiers employed in any communications system inherently distort signals as they amplify the signals. FM techniques do not suffer from such distortion because of their constant amplitude. Amplitude modulation, however, causes the distortion to become dependent on the input signal, so that the amplifier output signal is no longer simply an amplified replica of the input signal. Although an amplifier's input signal may be confined within a particular channel or frequency band, the distorted, amplified output signal typically includes out-of-band frequency components which would overlap one or more channels adjacent to the channel within which the input signal was confined, thereby interfering with communications in the overlapped channel(s).

Some degree of channel signal overlap due to unregulated amplifier distortion is acceptable in some cases. However, mobile communications systems place very stringent restrictions on out-of-band signal emissions in order to minimize channel-to-channel interference.

To reduce out-of-band signal emissions to an acceptable minimum the amplifier input signal is conventionally "predistorted" before it is fed into the amplifier. Before the signal is amplified, an estimate is made of the manner in which the amplifier will inherently distort the particular input signal by amplifying that signal. The signal to be amplified is then "predistorted" by applying to it a transformation which is estimated to be complementary to the distorting transformation which the amplifier itself will apply as it amplifies the signal. In theory, the effect of the predistorting transformation is precisely cancelled out by the amplifier's distorting transformation, to yield an undistorted, amplified replica of the input signal. Such amplifiers are said to be "linearized" in the sense that the output signal is proportional to the input signal, thereby eliminating the generation of out-of-band components.

Unfortunately, amplifier distortion varies in a complex, non-linear manner as a function of a wide range of variables, including the amplifier's age, temperature, power supply fluctuations and the input signal itself. Accordingly, it is not possible to define a single predistortion transformation which will cancel out any and all distorting transformations applied by the amplifier.

One prior art approach to the problem (exemplified by U.S. Pat. No. 4,462,001 issued July 24, 1984 for an invention of Henri Girard entitled "Baseband Linearizer for Wideband, High Power, Nonlinear Amplifiers") has been to construct a look up table containing a multiplicity of entries which define predistortion transformation parameters appropriate for use with a corresponding multiplicity of different input signals. That is, the effects of the amplifier's distortion on a range of input signals are pre-measured, the complementary predistorting transformations corresponding to each input signal are calculated, and parameters defining the calculated complementary transformations are stored in the table. In operation, the fluctuating power level of the signal to be amplified is continuously measured. The power measurement is then applied to the electronic embodiment of the table, from which the corresponding predistortion parameters are derived, so that the input signal sample may be predistorted before it is fed to the amplifier. However, Girard's approach accounts only for variation of the input signal, not for variation of the amplifier's other distorting characteristics. Because the amplifier's other distorting characteristics in fact vary it is necessary to continuously "adapt" the lookup table parameters by changing them in response to changes in the amplifier's other distorting characteristics.

Moreover, Girard's approach is based on separate tables containing amplitude and phase correction factors. This "polar coordinate" representation follows naturally from the common practice of representing amplifier distortion in terms of AM/AM and AM/PM characteristics. So far as the inventor is aware, all predistortion techniques prior to Girard's also attempted separate amplitude and phase correction.

Another prior art approach is exemplified by U.S. Pat. No. 4,700,151 issued Oct. 13, 1987 for an invention of Yoshinori Nagata entitled "Modulation System Capable of Improving a Transmission System". Nagata uses the real and imaginary quadrature components of the input signal sample to index into a lookup table containing predistortion transformation parameters. The real and imaginary components are each typically defined by at least 10 bits of information. Thus, Nagata employs a 20 bit index, which requires a lookup table containing $2^{20}$ entries (i.e. over 1 million entries). The lookup table entries are adaptively changed in response to variations in the amplifier's distorting characteristics. However, if the signalling channel is changed (a common occurrence in mobile communications systems) then every entry in Nagata's lookup table must be iteratively recalculated. This process can take 10 seconds or longer, which is unacceptable.

The present invention overcomes the disadvantages of the prior art. By storing table entries in rectangular coordinate format, it enables the subsequent predistortion operation to be performed more simply than Girard's polar coordinate approach. Further, it adapts to amplifier and oscillator changes, whereas Girard's predistorter does not. In comparison with Nagata's method, only a comparatively small lookup table is required. Signal phase rotators (required to stabilize Nagata's circuitry) are not required. Moreover, the lookup table entries are adaptively changed, within about 4 milliseconds ("msec.") in response to changes in the amplifier's distorting characteristics.

SUMMARY OF THE INVENTION

In accordance with the preferred embodiment, the invention provides a method of linearizing an amplifier to produce an amplified output sample $v$ in response to a predistorted input sample $v_d$ derived from an input modulation sample $v_m$, such that $v_a \simeq Kv_m$, where $K$ is the amplifier's desired constant amplitude gain. The squared magnitude $x_m$ of the input modulation sample $v_m$ is first derived. A table entry $F_i$ is then selected from a table containing $N_t$ values $F_i$ where $i = 0, 1, \ldots, N_t-1$. Each table entry corresponds to a squared magnitude value $x_{mi}$; and, for each table entry, $F_i G(x_{mi}|F_i|^2) \simeq K$, where $G(x)$ is the complex gain of the amplifier. The table entry selected is the one for which the absolute value $|x_m - x_{mi}|$ is minimized with respect to the table index $i$. The predistorted sample $v_d$ is then derived, in rectangular coordinates, as $v_d = v_m F_i$, viz:

$$Re(v_d) = Re(F_i) - Im(V_m)Im(F_i)$$

$$Im(v_d) = Re(v_m)Im(F_i) + Im(V_m)Re(F_i)$$

where $Re(x)$ is the real component of $x$ and $Im(x)$ is the imaginary component of $x$.

The aforesaid steps are sequentially repeated $k$ times. After each derivation of the predistorted sample $v_d(k)$, a sample $v_a(k)$ of the amplifier's output is derived. An error sample $e(k) = v_a(k) - Km_v(k)$ is also derived. This facilitates derivation of an adjusted value $F_i(k+1)$ of the table entry $F_i(k)$ selected during the $k^{th}$ selecting step, where:

$$F_i(k + 1) = F_i(k) + \alpha \frac{e(k)(F_i(k - 1) - F_i(k))}{e(k) - e(k - 1)}$$

where $\alpha$ is an appropriately chosen constant. Table entry $F_i(k)$ is then replaced with the adjusted value $F_i(k+1)$, and all of the steps are again sequentially repeated.

DETAILED DESCRIPTION OF THE PREFERRED EMBODIMENT

I INTRODUCTION

In the past, both theory and practice of mobile communications have emphasized constant envelope modulation, such as FM or Gaussian minimum shift keying ("GMSK"). These techniques allow power amplifiers to be operated in the nonlinear region near saturation, for power efficiency, yet they do not generate intermodulation products in nearby channels. However, continuing pressure on the limited spectrum available is forcing the development of more spectrally efficient linear modulation methods, such as 16-ary quadrature amplitude modulation ("16QAM") and quadrature phase shift keying ("QPSK") with pulse shaping. Since their envelopes fluctuate, these methods generate intermodulation products in a nonlinear power amplifier. In the mobile environment, restrictions on out-of-band emissions are stringent, and the designer is faced with two alternatives: back off an inefficient Class A amplifier to an even more inefficient, but linear, operating region; or linearize the amplifier.

The present invention provides a method for linearizing a power amplifier by predistorting its input. It is particularly well suited to baseband implementation using digital signal processing techniques, though hybrid variants are easily concocted. It has a number of advantages compared to previously published techniques; it is powerful and economical, and it adapts rapidly to amplifier or oscillator changes.

Figure 1:
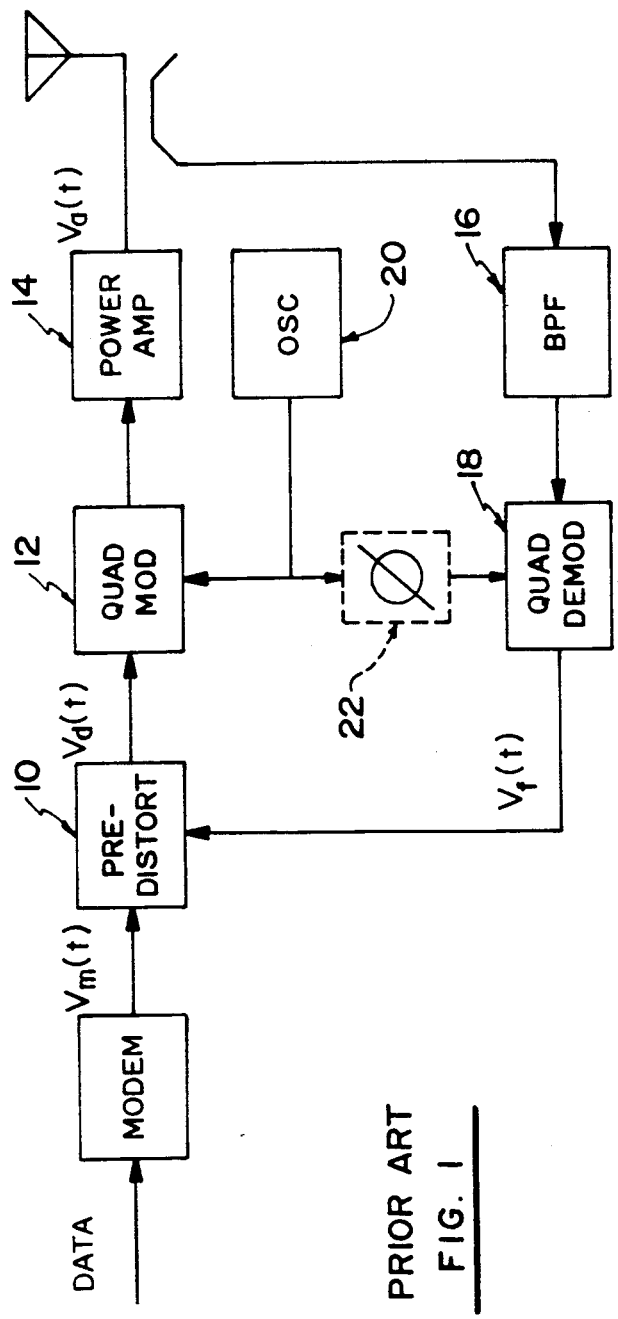
FIG. 1 is a block diagram of a typical prior art adaptively linearized amplifier.

FIG. 1 shows a generic model for many prior art adaptive amplifier linearization methods. All signal designations employed herein refer either to complex baseband signals or the to the complex envelope of bandpass signals. The linearizer or predistorter 10 creates a predistorted version $v_d(t)$ of the desired modulation $v_m(t)$, making use of its measurements $v_f(t)$ of the actual amplifier output $v_a(t)$. Quadrature modulator 12 creates a real bandpass signal from the components of $v_d(t)$ for input to power amplifier ("PA") 14. The feedback path (incorporating bandpass filter 16) directs a portion of the real bandpass PA output to quadrature demodulator 18 for recovery of the complex envelope. Its output $v_f(t)$ is a scaled, rotated, and possibly delayed version of $v_a(t)$. Note that the same oscillator 20 is used in up and down conversion for coherence, and that some methods require a phase shifter 22 for stability.

Linearization by Cartesian feedback [see generally Y. Akaiwa and Y. Nagata, "Highly Efficient Digital Mobile Communications with a Linear Modulation Method", IEEE J. Sel. Areas in Comms., vol SAC-5, no 5, pp 890–895, June 1987; A. Bateman, D.M. Haines, and R.J. Wilkinson, "Linear Transceiver Architectures", Proc. IEEE Vehic. Tech. Conf., pp 478–484, Philadelphia, 1988; and, S. Ono, N. Kondoh and Y. Shimazaki, "Digital Cellular System ith Linear Modulation", Proc. IEEE Vehic. Tech. Conf., pp 44–49, San Francisco, 1989] has the great virtue of simplicity; the amplifier input complex envelope $v_d(t)$ is proportional to the difference between the desired $v_m(t)$ and the measured amplifier output $v_f(t)$, as in a classical control system. However, its linearity and its bandwidth (i.e. the gain-bandwidth product) are critically dependent on loop delay. Linearization by Cartesian feedback is therefore ineffective for travelling wave tube amplifiers, or if there is additional analog or digital filtering at any point in the loop. Moreover, the stability of a system dependent upon linearization by Cartesian feedback depends on precise adjustment of the phase shifter, an adjustment that depends on the current channel in use.

A more robust alternative to Cartesian feedback is a predistorter ("PD"), in which the linearizer produces $v_d(t)$ by applying $v_m(t)$ to a memoryless nonlinearity complementary to that of the power amplifier. Feedback is used only for adaptation of the predistorter nonlinearity, rather than for real time calculation of $v_d(t)$. Because it is insensitive to loop delay, predistortion has attracted considerable attention.

Several prior art predistorters [e.g. M. Nannicini, P. Magni, and F. Oggioni, "Temperature Controlled Predistortion Circuits for 64 QAM Microwave power Amplifiers", IEEE MTT-S Digest, pp 99–102, 1985; and, J. Namiki, "An Automatically Controlled Predistorter for Multilevel Quadrature Amplitude Modulation", IEEE Trans. Commun., vol COM-31 no. 5, pp 707–712, May 1983] adaptively cancel the dominant 3rd order component of the PA nonlinearity. The complexity of such structures increases rapidly if extended to $5^{th}$ or $7^{th}$ order terms. Moreover, Class AB amplifiers have significant kinks in the transfer characteristic at low levels which are not well modelled by a cube law. The predistorter of Nannicini et al is noteworthy, because the quantity fed back is not required to be an accurate replica of the PA output $v_a(t)$, but rather a simple estimate of the power in the 3rd order spectral skirts, as measured by narrowband filters and envelope detection. This, however, restricts its use to modulation of a specific bandwidth.

Another prior art predistorter [H. Girard and K. Feher, "A New Baseband Linearizer for More Efficient Utilization of Earth Station Amplifiers Used for QPSK Transmission", IEEE J. Selected Areas in Commun., vol. SAC-1, no. 1, pp 46–56, January 1983; see also U.S. Pat. No. 4,462,001 supra] is based on complex gain, as is the present invention. However, it requires a dynamic phase shifter, and is not adaptive.

Yet another prior art predistorter [exemplified by U.S. Pat. No. 4,412,337 issued Oct. 25, 1983 for an invention of Robert H. Bickley et al entitled "Power Amplifier and Envelope Correction Circuitry"] differs from the present invention in that it makes no attempt to correct distortion due to AM/PM conversion, and is restricted to digital signalling consisting of a sequence of pulses.

A number of prior art predistorters [e.g. J. Graboski and R.C. Davis, "An Experimental MQAM Modem Using Amplifier Linearization and Baseband Equalization Techniques", Proc. Natl. Commun. Conf., pp E3.2.1-E3.2.6, 1982; U.S. Pat. No. 4,291,277 issued Sept. 22, 1981 for an invention of Robert C. Davis et al entitled "Adaptive Predistortion Technique For Linearizing a Power Amplifier For Digital Data Systems"; and, A.A.M. Saleh and J. Salz, "Adaptive Linearization of Power Amplifiers in Digital Radio Systems", Bell Syst. Tech. J., vol. 62, no. 4, pp 1019–1033, April 1983] are restricted to particular modulation formats. Implemented in digital baseband as RAM lookup tables ("LUTs"), with an entry for each predistorted point in the signal constellation, they are fast and require very little memory. However, they are limited to rectangular pulses, or to pulse shaping implemented by filtering following the PA, an unattractive arrangement. Saleh et al provide an adaptive version, which requires conversion between polar and rectangular representations.

Davis et al (supra) also include an adaptation algorithm of the linear type discussed in Section IV A below. Its convergence is therefore slower than the present invention, and it requires a phase shifter in the feedback path for stability (though this is not noted in the Davis et al '277 patent).

Figure 2:
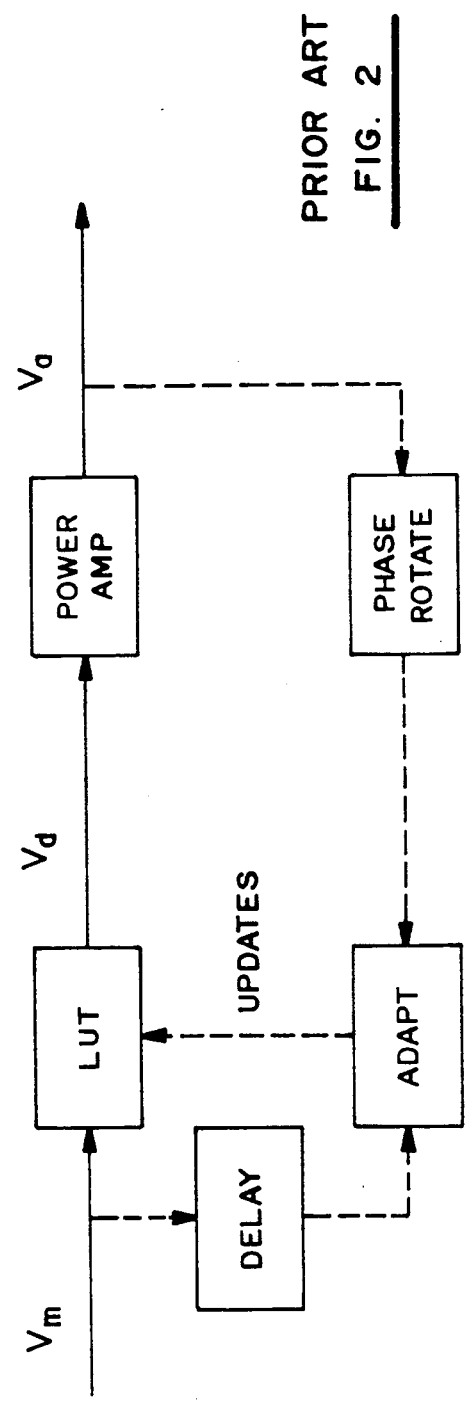
FIG. 2 is a block diagram of the mapping predistorter section of a prior art adaptively linearized amplifier.

The most general and powerful predistorter to date was reported by Y. Nagata, "Linear Amplification Technique for Digital Mobile Communications", Proc. IEEE Vehic. Tech. Conf., pp 159-164, San Francisco, 1989 (see also U.S. Pat. No. 4,700,151 supra). Nagata generalizes the table lookup approach of Grabowski et al and Saleh et al to provide the predistorted equivalent $v_d$ of any input value $v_m$ (FIG. 2), thereby mapping the complex plane into itself. Nagata's approach is therefore unrestricted by order and type of PA nonlinearity (provided it is memoryless). Since this permits pulse shaping prior to predistortion, it is not restricted by modulation format, either. Nagata also provided an update algorithm for adaptation of the table, and a delay compensation algorithm so $v_m(t)$ and $v_a(t)$ can be compared. Nagata's technique is hereinafter referred to as the "mapping predistorter" ("mapping PD").

Powerful though it is, the mapping PD has several drawbacks. The lookup table ("LUT") is 2 Mword long for 10 bit representation of the real and imaginary parts of $v_m$, and increases to 8 Mword for 11 bit representation. It requires a phase shifter in the feedback path for stability in the adaptation update, and convergence is very slow (10 sec, at 16 ksym/sec). Moreover, switching to a new channel requires readjustment of the phase shifter, and reconvergence of the table over another 10 sec.

The present invention, like the mapping PD, is unrestricted by modulation format, or by order of PA nonlinearity. In addition, it has some major advantages compared with the mapping PD. It requires over 4 orders of magnitude less table memory (typically under 100 complex word pairs). It reduces convergence time by a similar factor, to a few msec at 16 ksym/sec. It eliminates the reconvergence time following a channel switch, since the table for each channel is so small that it can be downloaded or simply retained in memory. Finally, it eliminates the need for a phase shifter in the feedback loop.

Section II describes the predistorter structure, and demonstrates its ability to suppress intermod products using only a small table. Section III analyzes the effect of PD nonidealities (especially limited table size) on the PA output; to the inventor's knowledge, such an analysis is missing from all previously published descriptions of linearizers. Section IV introduces a fast adaptation algorithm. Finally, Section V summarizes the results and their implications.

II THE GAIN BASED PREDISTORTER

A. Basic Structure

Figure 3:
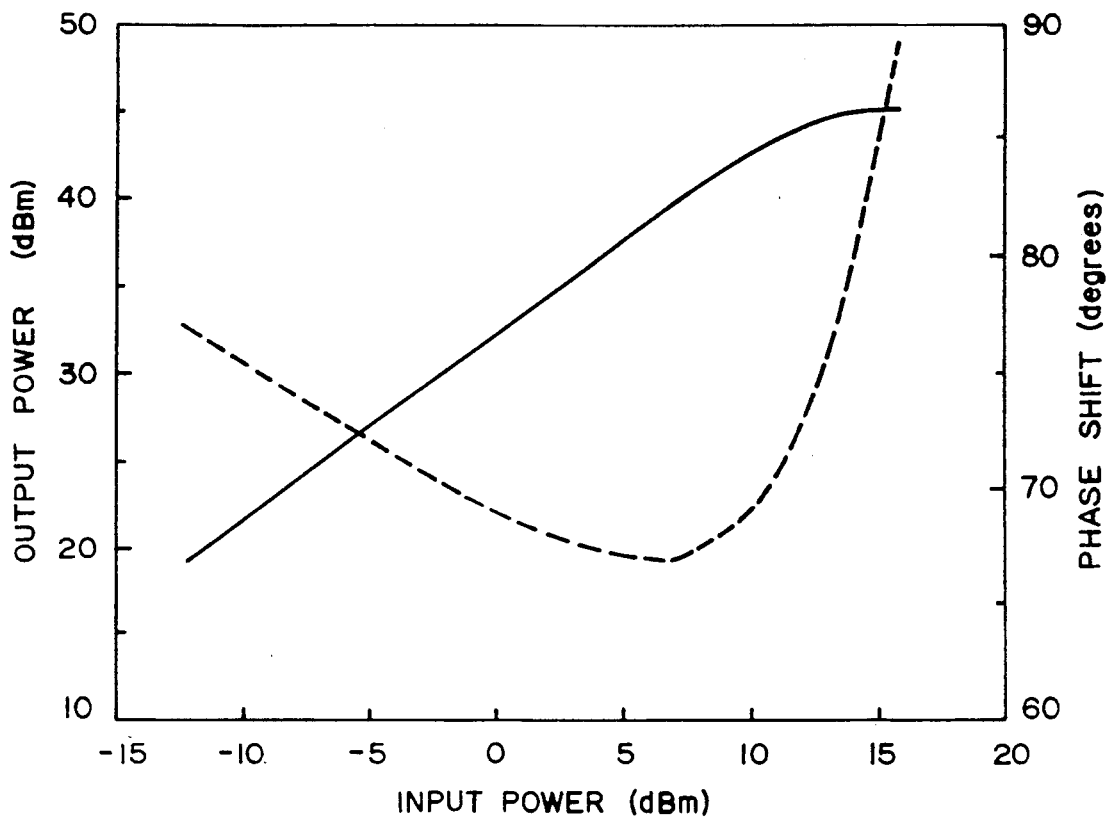
FIG. 3 is a graph on which the AM/AM and AM/PM characteristics of a typical Class AB amplifier are shown with output power (dBm) plotted as the left ordinate, phase shift (degrees) plotted as the right ordinate, and input power (dBm) plotted as the abscissa. The solid line plots output power and the dashed line plots phase shift.
Figure 4:
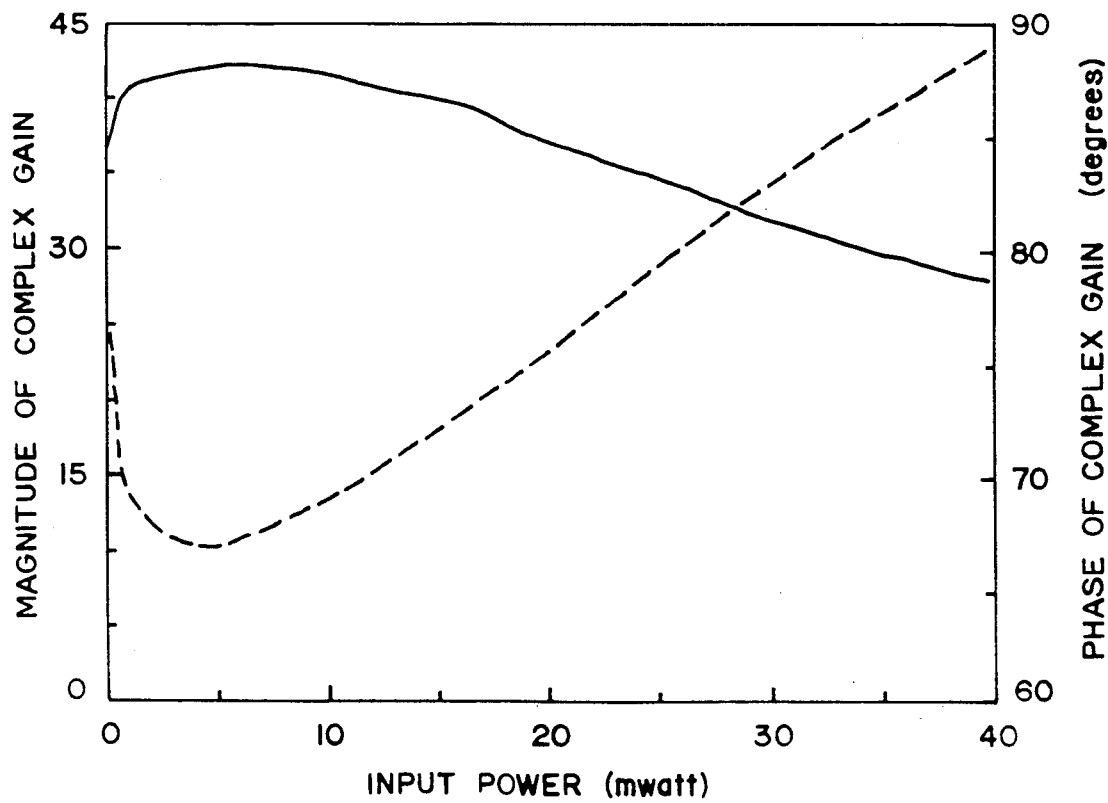
FIG. 4 is a graph on which the complex gain characteristics of a typical Class AB amplifier are shown with complex gain magnitude plotted as the left ordinate, complex gain phase (degrees) plotted as the right ordinate, and input power (mwatts) plotted as the abscissa. The solid line plots magnitude and the dashed line plots phase shift.

The amplifier can be modelled as a memoryless nonlinearity in several ways. The most productive for present purposes is as a level dependent complex gain. That is, the complex envelope of the amplifier's input $v_d$ and output $v_a$ are related by:

$$v_a = v_d G(|v_d|^2) = v_d G(x_d) \tag{1}$$

where $x_d$ denotes the squared magnitude of $v_d$; and $G(x_d)$, the complex gain of the amplifier, summarizes its AM/AM and AM/PM characteristics. Note that $G(x_d)$ depends only on the instantaneous power of the input, not on its phase. FIGS. 3 and 4 show the relation between bench measurements and the complex gain for a typical Class AB amplifier. The effect of compression is clearly evident at high input levels, as is the loss of gain at low levels, because of the crossover point between the push and pull halves of the amplifier.

The gain based PD of the present invention (FIG. 5) is not just modelled, but actually constructed, according to the complex gain formulation. Its input and output complex envelopes are related by:

$$v_d = v_m F(|v_m|^2) = v_m F(x_m) \tag{2}$$

where $x_m$ denotes the squared magnitude of $v_m$.

For any input power, the optimum value of the PD complex gain F is determined by equating the composite PD/PA nonlinearity to a nominal constant amplitude gain K. Normally, K is selected to be a little less than the amplifier's midrange gain. However, as shown in Section III, the choice of K has no effect on the signal to quantization noise ratio at the amplifier output. Combining (1) and (2), we define F implicitly by:

$$v_m F(|v_m|^2) G(|v_m|^2 |F(|v_m|^2)|^2) = K v_m \tag{3}$$

or:

$$F(x_m) G(x_m |F(x_m)|) = K \tag{4}$$

A fast technique for adaptive calculation of $F(x_m)$ is described in Section IV. Note that the PD complex gain $F(x_m)$ has a real domain, so that it can be represented by a one-dimensional LUT, rather than the two-dimensional LUT required by the mapping PD.

In practice, there is little point in trying to linearize an amplifier up to its saturated output power $P_{sat}$, because the distortion increases drastically in this region, and we are faced with rapidly diminishing returns on linearization effort. Accordingly, define the span S as the fraction of saturated power over which linearization is attempted. Thus the maximum output power is given by S $P_{sat}$. Realistic values for the span are in the range 0.95 to 0.98. An alternative description is the peak backoff ("PBO") of the PA in dB:

$$PBO = -10 \log(S) \tag{5}$$

The span in turn limits the domain of the linearizer:

$$0 \leq x_m \leq p_{mm} \tag{6}$$

where the maximum power of $v_m$ is given by:

$$p_m = S \, P_{sat}/K^2 \tag{7}$$

The implementation of $F(x_m)$ as a LUT with entries equispaced in input power $x_m$ will now be examined. Although a good case can be made for nonuniform spacing, as shall be seen in Section III, it would be at the cost of more computation when implemented digitally. With N table entries, the step size is given by:

$$D_g = P_{mm}/N_t \tag{8}$$

The range and midpoint of each step, and the corresponding table entries, are given for $i = 0, 1, \ldots, N-1$ as:

$$X_{mi} = \{x_m : iD_g \leq x_m < (i+1)D_g\} \quad (9)$$

$$X_{mi} = D_g(i + \tfrac{1}{2}) \quad (10)$$

$$F_i = F(X_{mi}) \quad (11)$$

Figure 6:
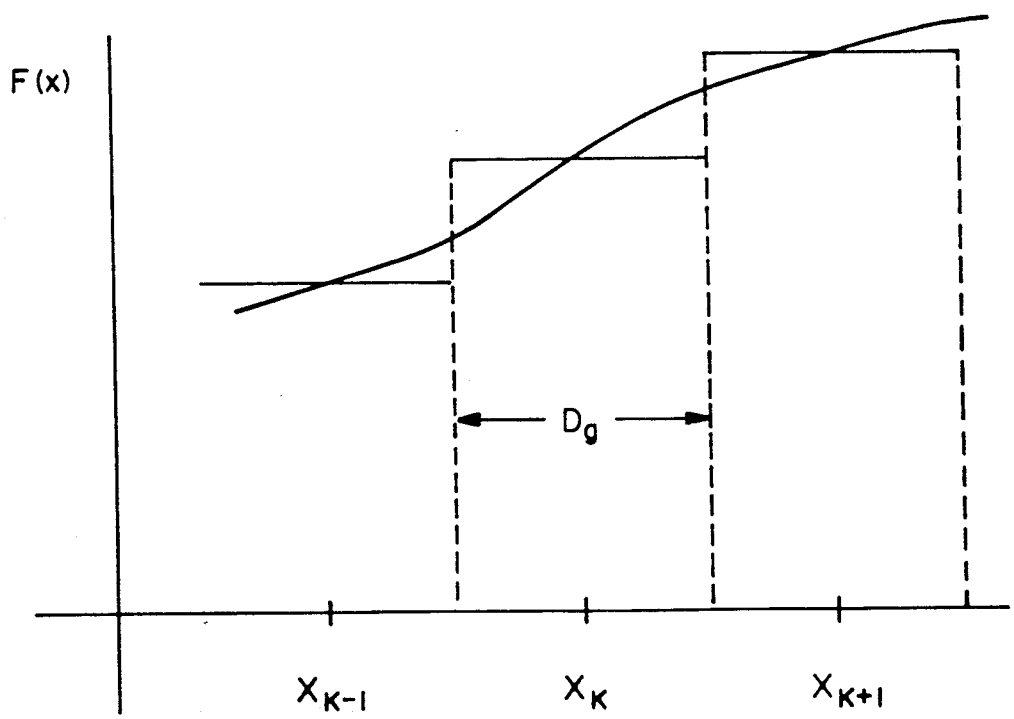
FIG. 6 is a graph illustrating the manner in which look up table entries $F(x)$ are optimized according to the relationship $F(x_m)G(x_m|F(x_m)|) = K$.

That is, the table is optimized according to (4) for the midpoint of each step, as shown in FIG. 6.

B. Performance of Basic Predistorter

This section demonstrates that even very small PD gain tables can produce major reductions in intermodulation products, using in all cases the Class AB amplifier of FIGS. 3 and 4 with a PBO of about 0.22 dB, giving a 95% span. First, define the output backoff ("OBO") as the dB difference between $P_{sat}$ and the average signal output power. Clearly OBO depends on the peak to average power ratio of the signal, hereinafter called the "signal backoff"("SBO"):

$$OBO = PBO + SBO \quad (12)$$

Large OBO values imply inefficient operation, due either to amplifier peak backoff or to the signal format. Note that compression lowers the SBO below the value characteristic of the signal in a linear regime.

Figure 7:
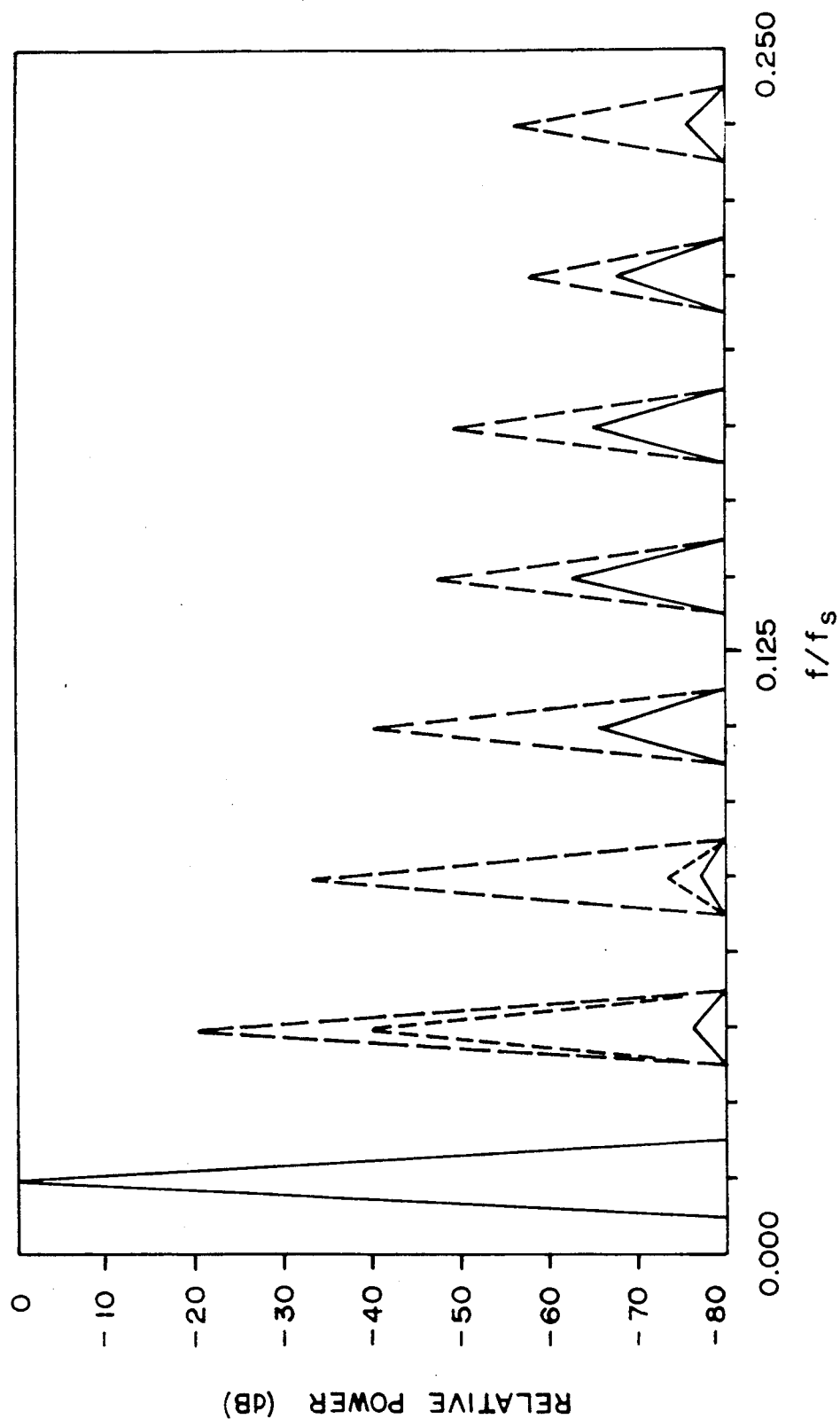
FIG. 7 is a graph illustrating the performance of the predistorter amplifier of FIG. 5 in a two tone test, with relative power (dB) plotted as the ordinate and the ratio $f/f_s$ plotted as the abscissa. The long dashed line plots the output of the power amplifier ("PA") only with PBO = 0.22 dB; the short dashed line plots the output of the PA only with PBO = 24.6 dB; and, the solid line plots the output of the combined PA and predistorter ("PD") with PBO = 0.22 dB.

The first example is a two-tone test. Although it does not fully exercise the nonlinearities, it is widely used. Its SBO is 3 dB in the absence of distortion. FIG. 7 shows the results of two-tone tests of the amplifier of FIG. 5 with PBO values of 0.22 dB and 24.63 dB (i.e. SBO values of 2.53 and 27.67 dB, respectively). All spectra are normalized to 0 dB for the desired components at $f/f_s = \pm 0.0156$, and the frequency is normalized by the sampling rate. Even with a PBO of 25 dB, the dominant IM products of the uncorrected amplifier are only 40 dB down. In contrast, the third curve on FIG. 7 shows that a 64 point predistortion table achieves the desired PBO of 0.22 dB (OBO of 3.22 dB) with IM products reduced below 60 dB.

Figure 8:
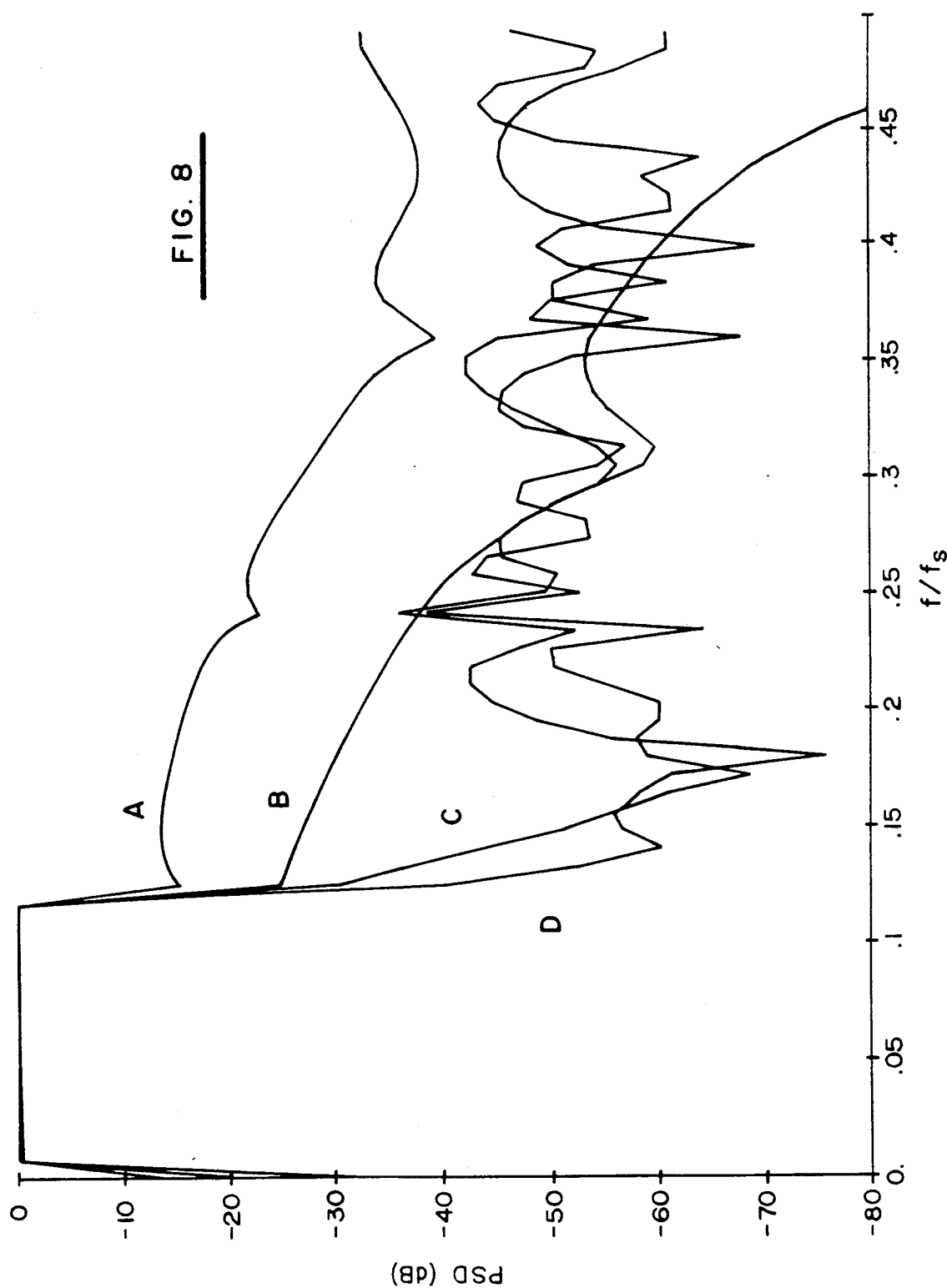
FIG. 8 is a graph illustrating the performance of the predistorter amplifier of FIG. 5 in a noise loading test, with power spectral density (dB) plotted as the ordinate and the ratio $f/f_s$ plotted as the abscissa. The line labelled "A" plots the output of the PA with no PD and OBO = 13.2 dB; the line labelled "B" plots the output of the PA with no PD and OBO = 33.7 dB; the line labelled "C" plots the output of the PA with a 32 point PD and OBO = 15.0 dB; and, the line labelled "D" plots the output of the PA with a 64 point PD and OBO = 15.0 dB.

The second example (FIG. 8) is a more demanding noise loading test. Thirty sine waves with equal amplitudes and randomly selected phases are located fifteen on each side of a center channel spectral null. The degree to which the null fills in at the output of the PA indicates the total power in the nonlinear products. Averaging of a few such output spectra, each with a new set of phases, is sufficient. The SBO for this signal is 14.8 dB. With a SBO of 13.2 dB (PBO of 0.22 dB), wide IM skirts about 14 dB down are evident in the uncorrected amplifier, and even an OBO of 33.7 dB lowers the IM by only about 8 dB. In contrast, both a 32 point and a 64 point PD table introduce a major reduction in intermod power at an OBO of 15 dB (PBO of 0.22 dB).

Figure 9:
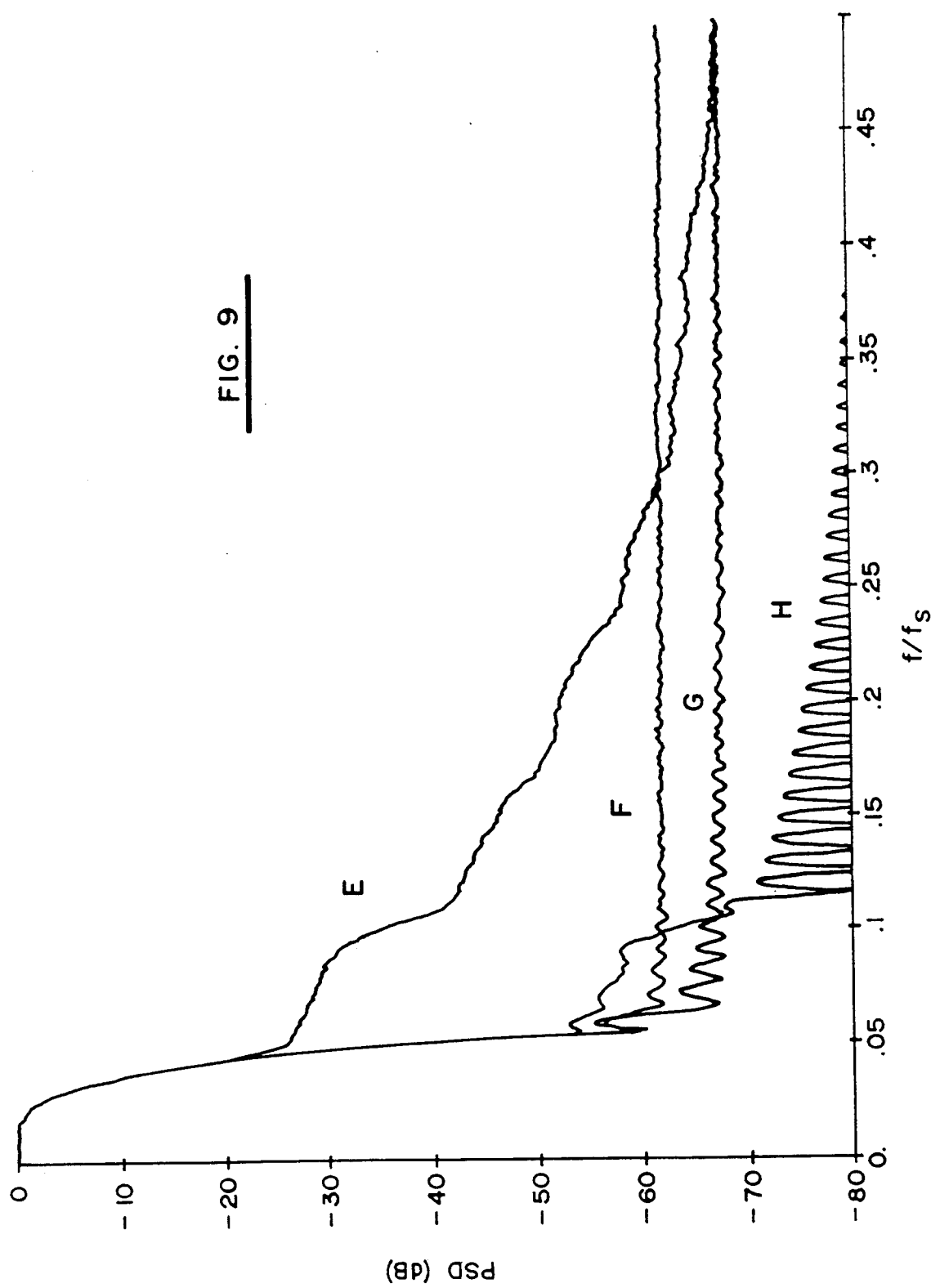
FIG. 9 is a graph illustrating the response of the predistorter amplifier of FIG. 5 to a 16QAM data signal, with power spectral density (dB) plotted as the ordinate and the ratio $f/f_s$ plotted as the abscissa. The line labelled "E" plots the output of the PA with no PD and PBO = 0.22 dB; the line labelled "F" plots the output of the PA with a 32 point PD and PBO = 0.22 dB; the line labelled "G" plots the output of the PA with a 64 point PD and PBO = 0.22 dB; and, the line labelled "H" plots the output of the PA with no PD and PBO = 30.24 dB.

The final example is more closely related to data transmission. The input signal is 16QAM, with a square root spectral raised cosine pulse with 25% rolloff, Hamming windowed to 7 symbols. The SBO is about 6 dB. As shown on FIG. 9, the $3^{rd}$, $5^{th}$ and $7^{th}$ order skirts are clearly visible when the uncorrected amplifier is operated at 0.22 dB PBO (3.0 dB OBO). Even with an OBO of 33.7 dB (PBO of 30.24 dB), out-of-band emission is still about 56 dB down, and the power efficiency of the amplifier is hopelessly small. Again a striking improvement is seen with the gain based PD operated at a PBO of 0.22 dB: even a 32 point gain table brings the skirts below 60 dB, and a 64 point table lowers the IM by another 6 dB (see Section III).

The foregoing examples demonstrate that major improvements in linearity can be achieved with very small tables: $N_t = 64$ entries, compared with over 1 million entries in the mapping PD. This dramatic reduction is due to exploitation of the rotational invariance of the amplifier nonlinearity. Of the two dimensions required to specify a point in the plane, only one (radius) need be quantized; the other (phase) remains continuous.

The cost, compared with the mapping PD, is computation. Both the squared magnitude of $v_m$ (for the table index) and the complex multiplication of $v_m$ by the table entry have to be performed at a sampling rate adequate to represent the highest order nonlinearity of interest. Such a PD has been implemented on a TMS320C25 at 240 kHz, which is sufficient for $7^{th}$ order nonlinearities when the nominal channel bandwidth is 30 kHz.

C. Nonuniform Spacing of Table Entries

The discussion and examples to this point have assumed a table (equations 9-11) optimized according to (4) for the midpoint of each step. In practice, however, the table entries may not be perfectly adjusted; indeed, Section III(C) makes an explicit calculation concerning this point. Although such departures from the condition (4) may degrade linearization, they nevertheless fall within the scope of the invention. Accordingly, the condition to be satisfied by the table entries is:

$$F_i G(X_{mi} | F_i |^2) \simeq K \quad (12a)$$

The foregoing discussion and examples have also assumed table entries equispaced in power $x_{mi}$. The generalization to nonuniform spacing is straightforward. The table contains $N_t$ distinct values of input power $x_{mi}$, each with an associated $F_i$ value satisfying (12a). In the case of nonuniform spacing, the table index i is determined for an arbitrary input power $x_m$ as the one for which the $x_{mi}$ value is closest to the $x_m$ value; that is, the table index i minimizes the absolute value $|x_m - x_{mi}|$. The range of each step is therefore given by:

$$X_{mi} = \{x_m : (x_{m,i-1} + x_{mi})/2 \leq x_m < (x_{mi} + x_{m,i+1})/2\} \quad (12b)$$

The ranges and the table entries selected by the predistorter are identical to those given earlier in (9-11) if the table entries are uniformly spaced in $x_{mi}$.

D. Alternative Selection Criteria

Equations (9-11), which define selection of the best table entry, are equivalent to:

$$i = round(x_m/D_g) \quad (12c)$$

where round(x) is the closest integer to x. Alternative selection criteria may be desirable in the interests of implementation simplicity:

$$i = floor(x_m/D_g) \quad (12d)$$

and:

$$i = ceil(x_m/D_g) \quad (12e)$$

where floor (x) and ceil (x) represent, respectively, the greatest integer less than or equal to x, and the smallest integer greater than or equal to x. Although these latter two selection criteria will, in general, degrade linearization accuracy, doubling the table size restores the performance, as hereinafter shown in Section III(B). All three criteria are considered to fall within the scope of the present invention.

The general form of the selection criterion, including nonuniform spacing, follows from (12b–12c). The selected table index is either of the two values:

1. i, such that $x_{mi}$ is the largest table entry less than or equal to $x_m$; or,
2. i, such that $x_{mi}$ is the smallest table entry greater than or equal to $x_m$. That is to say, we can select either of the table entries bracketing $x_m$.

E. Interpolation of Table Entries

Better use of the table can be made, at the cost of additional computation, by interpolating a value from the table. By way of example, a linearly interpolated value results from the calculation:

$$F(x_m) = F_{i-1} + \frac{(F_i - F_{i-1})(x_m - x_{m,i-1})}{(x_{mi} - x_{m,i-1})} \quad (12f)$$

where i is such that $x_{mi}$ is the smallest table entry greater than or equal to $x_m$. This, and other standard interpolation formulae [see, for example, Sgermund Dahlquist and Ake Bjorck, Numerical Methods, Prentice-Hall, 1974], are also within the scope of the present invention.

III ERROR ANALYSIS OF THE PREDISTORTERS

Figure 5:
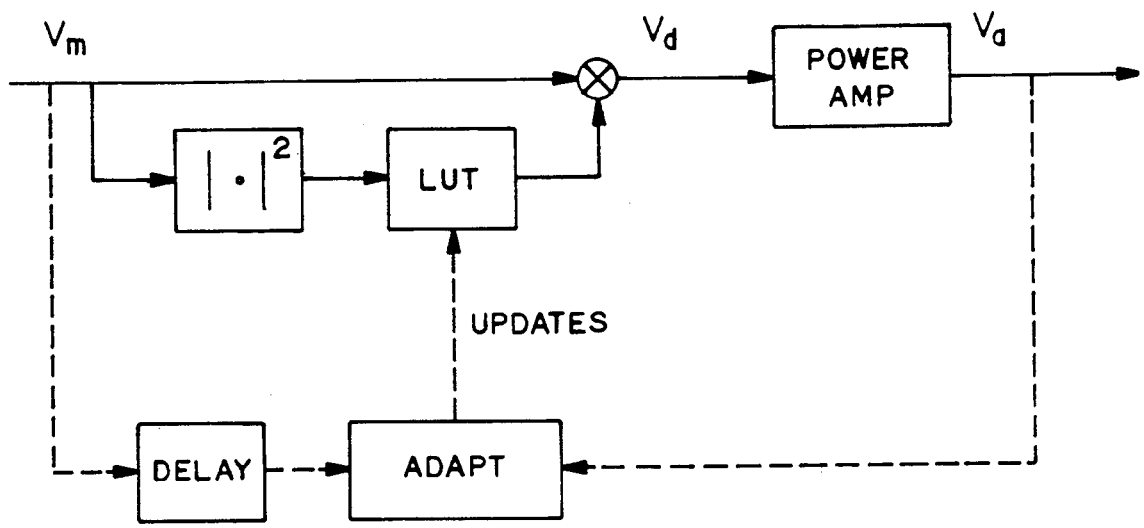
FIG. 5 is a block diagram of a gain based predistorter amplifier constructed in accordance with the invention.

Section II presented experimental evidence that the gain based PD of FIG. 5 can achieve significant reduction in IM products with a table four orders of magnitude smaller than that of the mapping PD. This section provides an analytical explanation for the results, by exploring the relation between PA characteristics and table size. Among other findings, it will be demonstrated that table size effects show up as relative error in the gain based PD, compared with absolute error in the mapping PD; that error power in the gain based PD decreases inversely as $(N_t)^2$, rather than inversely as $N_t$ in the mapping PD; and that the jitter in the gain table entries caused by adaptation can be compensated by a relatively small increase in table size.

A. The Mapping Predistorter

In the mapping PD, the input $v_m$, representing the desired output of the amplifier, is quantized to several bits in its real and imaginary parts separately, and acts as an index to the table. The table size is determined by the number of bits; for example, with 10 bit accuracy, $2^{20}$ or about 1 million table entries are needed. Note that the number of bits in each table entry is a different issue. For simplicity, assume that the table has infinite precision.

Figure 10:
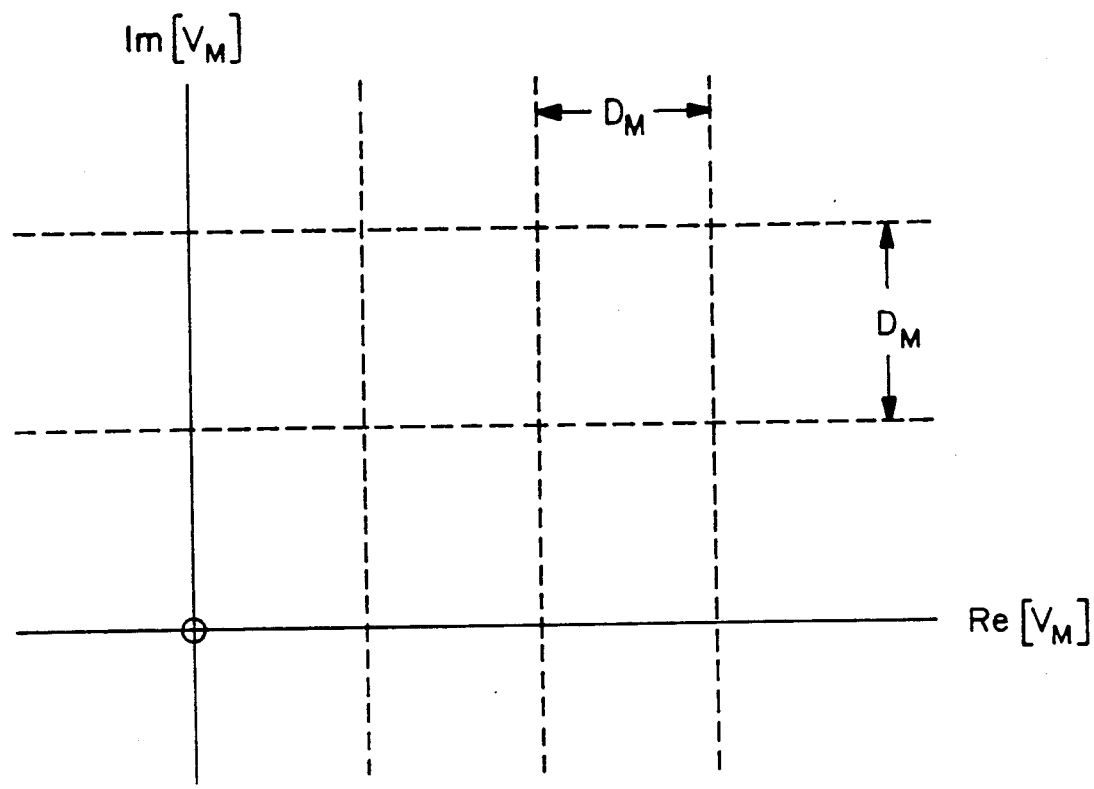
FIG. 10 illustrates partitioning of the input space ($v_m$ space) of the mapping predistorter of FIG. 2 into quantization cells.

Analysis of the effects of input quantization through two nonlinearities is surprisingly straightforward. Imagine the input space ($v_m$ space) as partitioned into quantization cells, as shown in FIG. 10. If there are $N_t$ entries in the two-dimensional table, then each cell has width:

$$D_m = \sqrt{2 P_{mm}/N_t} \quad (13)$$

since we associate maximum power $P_{mm}$ with the extreme corner cells. All $v_m$ values in a cell are mapped onto a single $v_d$ value, which we assume to be the correct predistorter value for the center of the cell. Thus the amplifier output $v_a$ has its desired value $Kv_m$ only at the cell centers. At other points in the cell there is a quantization error $e_m$ (where the subscript denotes the mapping PD):

$$v_a = Kv_m + e_m \quad (14)$$

which is bounded in its real and imaginary parts by $KD_m/2$:

$$|Re[e_m]| \leq KD_m/2 \quad |Im[e_m]| \leq KD_m/2 \quad (15)$$

Now, make the usual assumptions in quantization analysis: the error $e_m$ is a random variable independent of $v_m$, uniformly distributed over a cell, and its real and imaginary parts are independent. With these assumptions, the variance of the error $e_m$ can be calculated:

$$\sigma_{em}^2 = \tfrac{1}{2} E[|e_m|^2] = K^2 D_m^2/12 \quad (16)$$

or, in terms of table size:

$$\sigma_{em}^2 = K^2 P_{mm}/6N_t \quad (17)$$

A signal to noise ratio ("SNR") can be calculated if the statistics of $v_m$ are known. Assume for simplicity that $v_m$ is also uniformly distributed over its domain, in which real and imaginary parts are bounded in magnitude by $(P_{mm}/2)$. Then $SNR_m$, the ratio of signal to quantization noise powers at the PA output with a mapping PD, is given by:

$$SNR_m = K^2 \sigma_{em}^2 = N_t \quad (18)$$

A more common measure of out-of-band emission is the ratio of peak power spectral densities (PSDs) of signal and noise. Since the additive error appears as white noise, this quantity can be estimated as:

$$PSD_{va}/PSD_{em} \approx SNR_m W_m/f_s \quad (19)$$

where $W_m$ is the two-sided bandwidth of the modulation, and $f_s$ is the sampling rate at which the predistorter operates.

In summary, the effect of finite table size in the mapping PD is to add independent white noise, for which the SNR is proportional to the table size $N_t$.

B. The Gain Based Predistorter

The gain based predistorter described in Section II has a table indexed by input power $x_m$. Thus the quantization cells in $v_m$ space are annular regions, or rings. Because the table entries are equispaced in power, the rings are more closely spaced in amplitude as the input level increases. This improves representation accuracy in the region near saturation, where amplifier distortion usually varies most rapidly. Unfortunately, it does little for the distortion at low input levels characteristic of Class AB amplifiers.

Before examining the effect of table size, a useful relation is established. Since (4) determines the correct value of F at every $x_m$, we also have:

$$\frac{d}{dx_m}[f(x_m) G(x_m|F(x_m)|^2)] \equiv 0 \quad (20)$$

Carrying through the differentiation gives:

$$F(x_m)G(x_m|F(x_m)|^2) + \quad (21)$$
$$F(x_m)G'(x_m|F(x_m)|^2)(|F(x_m)|^2 +$$
$$2x_m Re[F(x_m)F^*(x_m)]) = 0$$

where the apostrophe indicates a derivative and the asterisk a conjugate.

Now to determine the effect of quantization of F(x), that is, the effect of a finite number $N_t$ of table entries. At any point, imagine that the ideal value of F is perturbed by a small error $\Delta F$. This changes the input to the PA and therefore induces a small change $\Delta G$ in G. The PA output is now given by:

$$\begin{aligned} v_a &= v_m(F + \Delta F)(G + \Delta G) \\ &\approx v_m(K + G\Delta F + F\Delta G) \\ &= v_m(K + G\Delta F + 2xFG'Re[F^*\Delta F]) \end{aligned} \quad (22)$$

where F, G, F' and G' denote quantities evaluated before the perturbation. Note that the error in F induces a relative error in $v_a$, in contrast to the absolute error seen earlier in the mapping PD.

Next, the error in F is related to the table size. Recall from Section II that the table entry is optimized for the midpoint of the step. The error in F is approximately proportional to $\Delta x_m$, the difference between actual input power and the midpoint of the step:

$$\Delta F \approx F'(x_m)\Delta x_m \quad (23)$$

Substitution of (23) into (22) gives the perturbed amplifier output:

$$v_a \approx v_m(K + (GF' + 2 \times FG'Re[F^*F'])\Delta x_m) \quad (24)$$

which, from (21), can be rewritten as:

$$v_a \approx v_m(K + F|F|^2 G'\Delta x_m) = Kv_m + e_g \quad (25)$$

where $e_g$ is the quantization error at the PA output with a gain based PD. Substitution of the basic inverse relationship (4) gives expressions for the output quantization error $e_{gi}$ in the $i^{th}$ step in terms of PA characteristics only:

$$e_{gi} \approx v_m F_i |F_i|^2 G'_i \Delta x_m = v_m K^3 \frac{G'_i}{G_i|G_i|^2} \Delta x_m \quad (26)$$

where $G_i$ and $G'_i$ stand for G(x) and G'(x), respectively, evaluated at:

$$x_{di} = x_{mi}|F_i|^2 \quad (27)$$

To determine the SNR at the amplifier output, assume that there are enough table entries to make $\Delta x_m$ a random variable uncorrelated with x and uniformly distributed over $[-D_g/2, D_g/2)$. Then the variance of $e_{gi}$ evaluated over the $\Delta x_m$ ensemble is:

$$\sigma^2_{egi} = \frac{1}{2}E[|e_{gi}|^2] = \frac{1}{2} x_{mi} K^6 \frac{|G'_i|^2}{|G_i|^2} \frac{D_g^2}{12} \quad (28)$$

Substitution of (7) and (8) for $D_g$ gives:

$$\sigma_{egi}^2 = (1/24)(SP_{sat}/N_t)^2(|G'_i|^2/|G_i|^2)x_{ai} \quad (29)$$

where $x_{ai} = K^2 x_{mi}$. Note that the error variance expressed this way in terms of amplifier output quantities does not depend on the nominal amplitude gain K. The average quantization noise power can be written:

$$\sigma_{eg}^2 \sum_i p_i \sigma_{egi}^2 \quad (30)$$

where $p_i$ is the probability density function of the levels $x_{ai}$ induced by the particular modulation, such as QPSK or 16QAM. The overall SNR in the gain based PD is therefore given by:

$$SNR_g = \sigma_{va}^2/\sigma_{eg}^2 = \tfrac{1}{2}\Sigma_i p_i x_{ai}/\Sigma_i p_i \sigma_{egi}^2 \quad (31)$$

As in the mapping case, the ratio of spectral densities of signal and additive quantization noise depends on bandwidth and sampling rate:

$$PSD_{va}/PSD_{eg} \approx SNR_g W_m/f_s \quad (32)$$

The variance in the output quantization error is inversely proportional to the square of the table size, as shown by (29) and (30). This contrasts with the mapping based PD, in which error power varies as the simple inverse of table size. The variance also depends on the AM/AM and AM/PM characteristics of the amplifier through $G_i$ and $G'_i$, and on the modulation, through $p_i$. Again this differs from the mapping PD, in which the SNR depends on neither of these characteristics.

Figure 11:
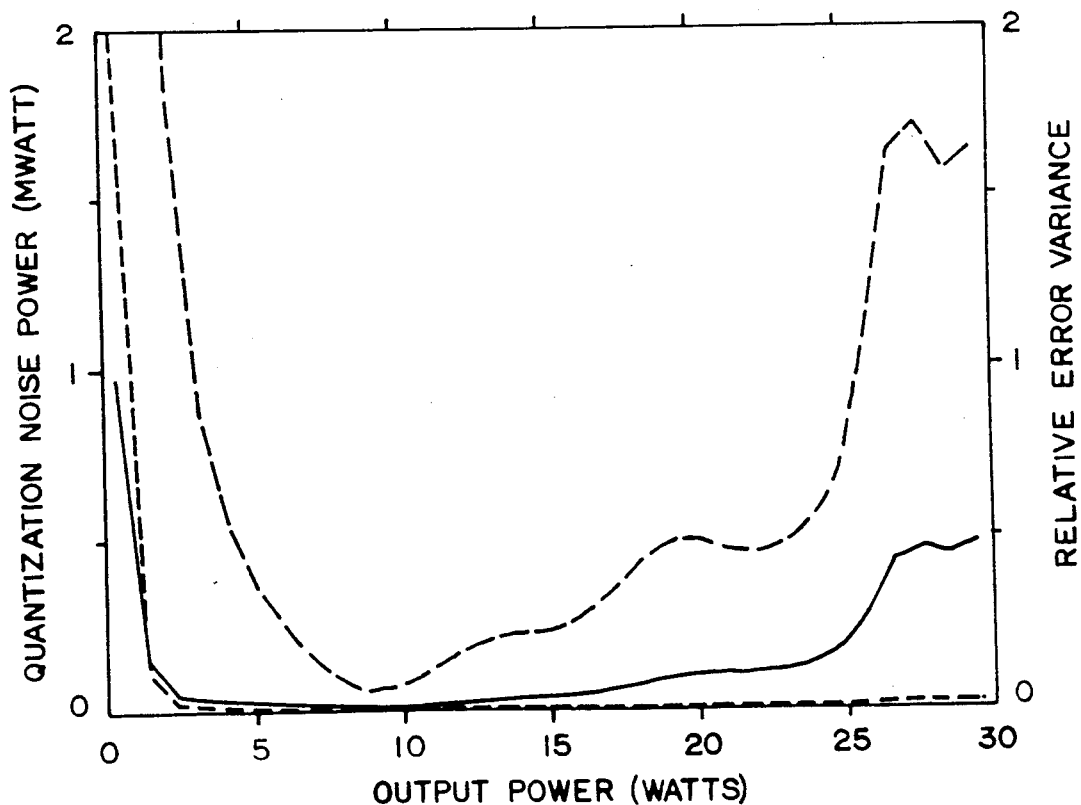
FIG. 11 is a graph on which the distribution of intermodulation power with instantaneous output power of the combined amplifier of FIG. 5 and 32 point predistorter is shown, with quantization noise power (mwatts) plotted as the left ordinate, relative error variance plotted as the right ordinate, and output power (watts) plotted as the abscissa. The solid line plots quantization noise power; the short dashed line plots relative error variance × 1000; and, the long dashed line plots relative error variance × 100,000.

FIG. 11 illustrates the variation of $\sigma_{egi}^2$ as a function of level for a 32-point gain table and the Class AB amplifier of FIGS. 3 and 4. The quantization error is negligible over most of the input range. As expected, the kink at very low input levels contributes the largest error. Thus modulation techniques which avoid very low levels, such as QPSK with $\pi/4$ precession, can substantially reduce the IM spectral skirts. However, $SNR_g$ is clearly in the acceptable range, even if the low levels are included. Also shown is the relative error variance, obtained by dividing $\sigma_{egi}^2$ by $x_{ai}$. It, too, rises sharply at low levels.

Finally, note that there are ways to reduce the error further. First, doubling the table size reduces it by a factor of 4, or 6 dB. Second, nonuniform steps in the gain table would allow representation of both low and high amplitudes more accurately; however, this is at the cost of additional computation, since determining the correct table index from x is more difficult. Finally, from (32), we can decrease the IM PSD relative to the signal by increasing the sampling rate $f_s$. Again, this is at the cost of additional computation.

C. Effect of Adaptation Jitter

It was demonstrated above that output quantization noise is negligible in the case of a fixed predistorter, optimized at the center point of each quantization step. An adaptive PD, however, is not optimized for that value. As shall be seen in Section IV, the successive $\Delta x_m$ values are scattered over the range $[-D_g/2, D_g/2)$, and the adaptation algorithm chases a moving target. This causes the table entry to jitter, and the output error to increase. This section demonstrates that small increases in table size are sufficient to compensate for adaptation jitter.

First, consider the worst case: successive $\Delta x_m$ values alternate between the two extremes of $-D_g/2$ and $D_g/2$, and the algorithm converges so quickly that the table entry is always optimized for the previous $\Delta x_m$ value. This situation is similar to the fixed predistorter considered above, with $\Delta x_m$ always taking the values $\pm D_g$. The variance is therefore $D_g^2$, rather than $D_g^2/12$, as in the earlier case. The twelve-fold increase in error variance can be compensated by increasing the number of entries in the table by a factor of 12, about 3.5.

A more reasonable assumption is that successive $\Delta x_m$ values are independent, and uniformly distributed over $[-D_g/2, D_g/2]$. Pessimistically again, assume that the convergence algorithm leaves the table entry optimized for the previous value. This situation is similar to the fixed predistorter with $\Delta x_m$ equal to the difference of two uniformly distributed variates; that is, its pdf is triangular over $[-Dg, Dg]$:

$$P_{\Delta xm}(\xi) = \begin{cases} (1 - |\xi|/D_g)/D_g, & |\xi| \leq D_g \\ 0, & \text{elsewhere} \end{cases} \quad (33)$$

Its variance is therefore $D_g^2/6$, that is, twice the variance of the fixed predistorter case. The output quantization error power doubles, but this can be compensated simply by increasing the number of table entries by a factor of 2.

A still more accurate model would account for the averaging effect introduced by a realistic adaptation algorithm, one without instant convergence. Since $\Delta x_m$ is uniformly distributed, $F_i$ will tend to be close to its optimized midpoint value, and the required increase in table size will be relatively small, on the order of about 20%.

IV. ADAPTATION OF THE PREDISTORTER

General Comments

Amplifier characteristics drift because of aging, temperature changes, supply voltage variations, and channel switches. Generally, this means that if spectral emission constraints are stringent enough to require the use of a predistorter, then the PD will have to be adaptive.

Several previously reported adaptive predistorters are cited in Section I. In all cases, though, they display linear convergence; that is, they add roughly the same number of bits of accuracy in each iteration. In this section, it will be demonstrated that much faster convergence can be obtained with algorithms made possible by the power of a digital signal processing ("DSP") implementation. In addition, the phase shifter or phase locked loop ("PLL") in the feedback path can be discarded.

There are several issues of importance in adaptation. For example, three scenarios of interest are initial convergence with an unknown amplifier, reconvergence after a channel switch, and tracking slow drift. Performance issues include speed, stability and computational load.

A. Linear Convergence Techniques

In addition to the mapping PD itself, Nagata (supra) provided an adaptation algorithm. Its combination of reasonable speed and reasonable computational load appears to make it the best so far of the linear convergence methods.

Figure 12:
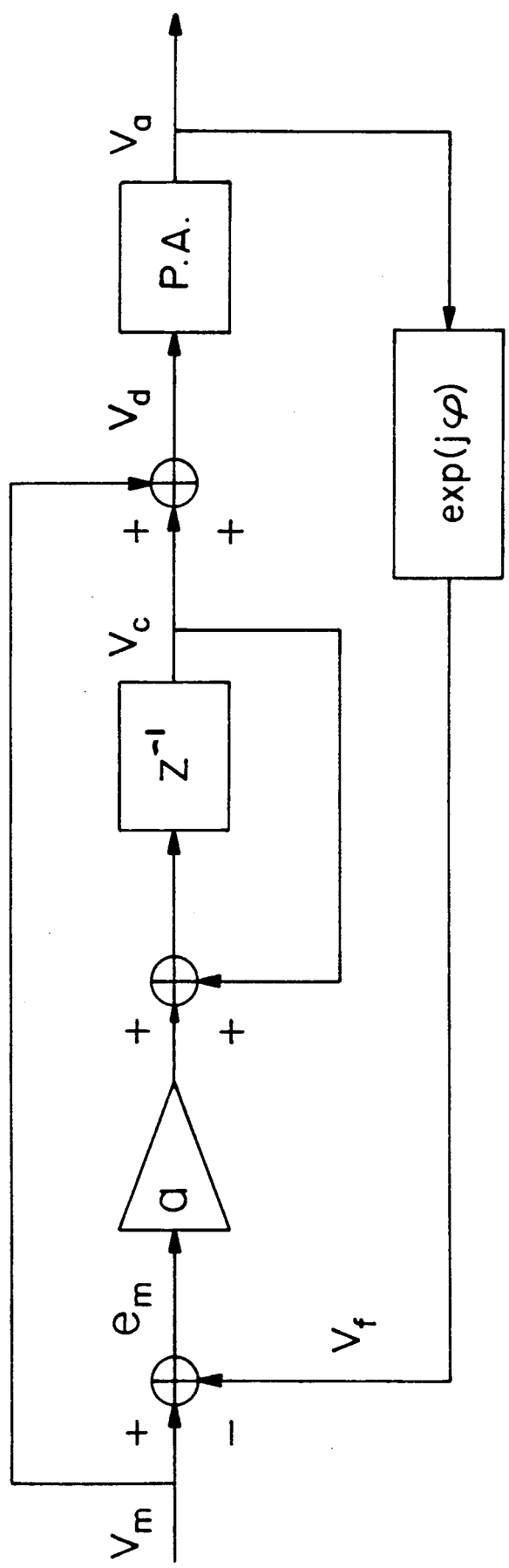
FIG. 12 is a block diagram of a prior art adaptively linearized amplifier of the type exemplified by U.S. Pat. No. 4,700,151 Nagata.

Each table entry is updated when the input $v_m$ passes through the corresponding quantization cell. FIG. 12 shows that the iteration update for a given cell is structured as a feedforward path with a correction signal $v_c$. Note that the time step in the delay block corresponds to an iteration, not a sample time. Apart from the nonlinearity of the power amplifier, the loop resembles a classical feedback control system, and it can be analyzed in the same way. When it converges, therefore, the error decreases exponentially with iteration number; that is, it adds roughly the same number of bits of accuracy with each iteration.

Figure 13:
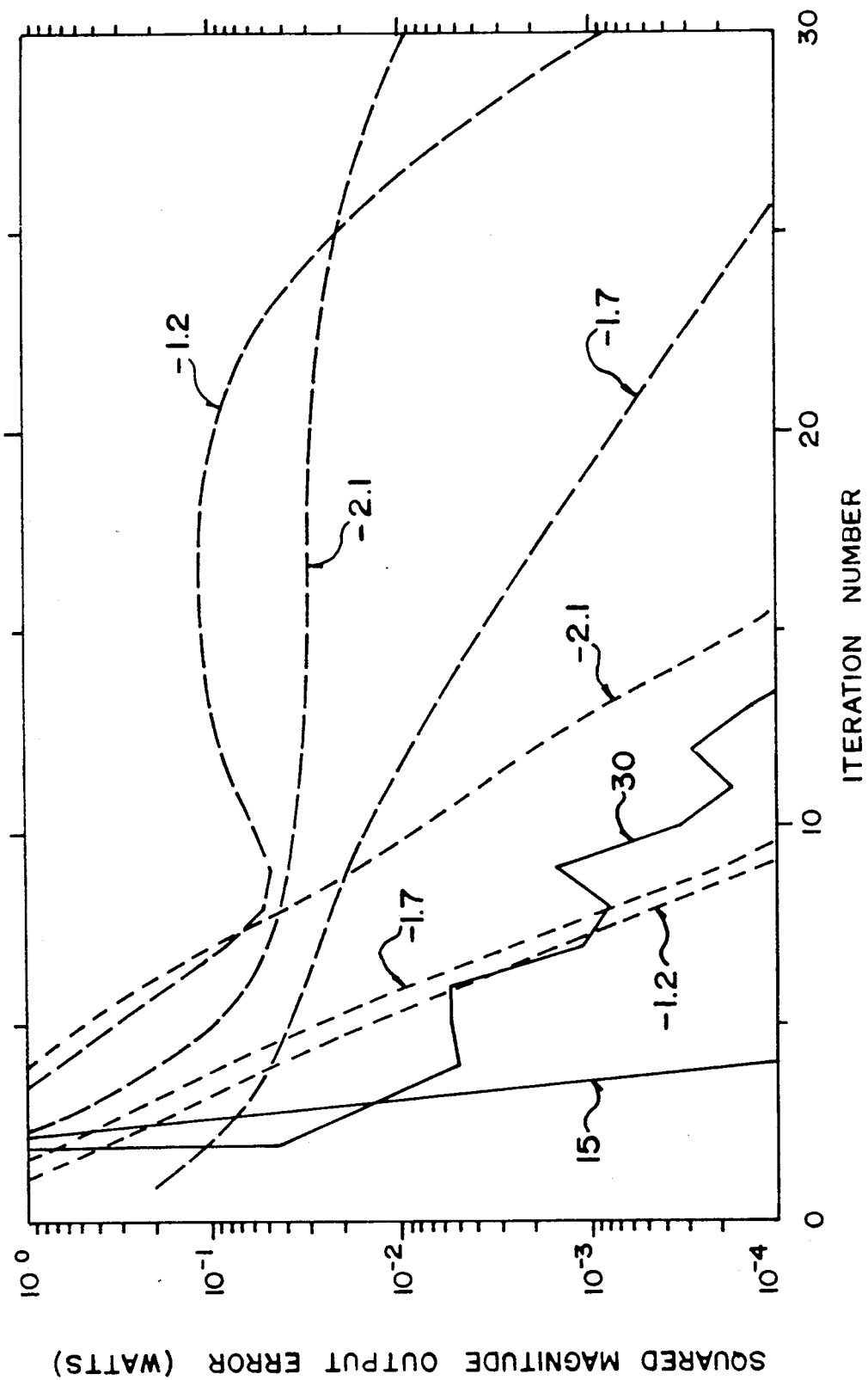
FIG. 13 is a graph on which the convergence behaviour of the linear and secant update algorithms is shown, with squared magnitude output error (watts) plotted as the ordinate, and iteration number plotted as the abscissa. The long dashed lines illustrate the linear convergence algorithm's performance at 30 watts. The short dashed lines illustrate the linear convergence algorithm's performance at 15 watts. The solid lines illustrate the secant algorithm's performance. The numbers applied to the dashed lines denote the feedback phase shift whereas those applied to the solid lines denote the output power in watts.

This algorithm was tested using the Class AB amplifier introduced earlier. The convergence of the squared magnitude of the output error $e_m$ for selected parameters is shown in FIG. 13. The iteration parameter a was set at 0.4; larger values resulted in faster convergence at low amplitudes, but failure at high amplitudes. The curves demonstrate that convergence is slow at high output power levels (30 watt is about 0.22 dB PBO). Moreover, the phase shift $\phi$ must be within about 0.5 rad of its optimum value $-1.7$ rad, or the iteration diverges. With an additional 3 dB backoff (15 watt output), convergence is faster, and less sensitive to phase shift (though of course $\phi$ must remain within about 1.5 rad of its optimum value to avoid positive feedback).

The phase shift can be implemented either in DSP at baseband, or as a PLL in the down conversion chain, as indicated by Nagata (supra). In either case it represents an additional load of computation or hardware.

The large number of table entries (about $10^6$ complex values) results in very slow convergence of the PD as a whole, since each entry exercised by the modulation scheme must be iterated many times, as demonstrated above. The estimate by Nagata (supra) is 10 sec for binary modulation at 16 ksym/sec. The present inventor's simulation suggests this is optimistic. To make matters worse, a switch of channel normally results in a phase jump in the loop, which forces reconvergence, with another 10 sec delay.

In favour of Nagata's adaptation algorithm is the low computational load: each iteration requires 3 complex additions, a real by complex multiplication and no divisions.

B. Secant Method

To update the table entries in the gain based PD, the adaptation is formulated as a root finding problem to which a number of classical methods can be applied. From (25), the desired value of F for a given $v_m$ is the root of:

$$e_g(f) = v_d(f) - K v_m) v_m^* \quad (34)$$

where $v_m^*$ is the complex conjugate of $v_m$. The quantity $e_g(F)$ can be measured as the difference between the actual and the desired amplifier output. Ideally, each table entry $F_i$ is a root of (3) if the squared magnitude of $v_m$ equals $x_{mi}$, the midpoint of the quantization step.

Since the derivative of $e_g(F)$ is not available, Newton's method [Germund Dahlquist and Ake Bjorck, Numerical Methods, Prentice-Hall, 1974] cannot be applied to (34) to obtain quadratic convergence. A reasonable alternative, which offers convergence speed intermediate between linear and quadratic convergence, is the secant method [see Dahlquist et al (supra)]:

$$F_i(k+1) = \frac{F_i(k-1)e_g(F_i(k)) - F_i(k)e_g(F_i(k-1))}{e_g(F_i(k)) - e_g(F_i(k-1))} \quad (35)$$

where $F_i(k)$ is the $k^{th}$ iteration of table entry i. The iteration update is applied whenever $v_m$ falls into the $i^{th}$ quantization step. It is easy to show [see Dahlquist et al, supra] that the number of bits of accuracy in $F_i$ increases by a factor of 1.6 at each iteration in the neighbourhood of the root, which is considerably faster than the linear convergence examined earlier.

Circuitry following the predistorter (such as quadrature modulator, up conversion, the power amplifier itself, and the feedback circuitry) may introduce time delay. In this case a compensating delay should be applied to $v_m$ in (34), so that $e_g(F)$ remains the difference between actual and desired outputs.

The iteration (35) is familiar for real roots of real functions. Strictly speaking, it is the true secant method in the complex domain only if $e_g(F)$ is analytic. However, from (3) we can write:

$$e_g(f) = (v_m F\, G(x_m|F|^2) - Kv_m)v_m^* \quad (36)$$

from which it is evident that $e_g(F)$ is not analytic. A pragmatic view is taken at this point: (35) defines an iteration which has been found experimentally to work very well.

The convergence of squared magnitude of $e_g$ when the method is applied to the same Class AB amplifier used earlier is shown in FIG. 13. The two starting points for the iteration were $F_i(0)=0$, and $F_i(1)=0.001$; although they are both real, the iteration quickly moves out into the complex plane. Convergence at 30 watts is significantly slower than at 15 watts. This is a consequence of saturation in the amplifier; near the root the derivative (or rather the norm of the Jacobian matrix) also becomes very small, which is a classical difficulty for both Newton's method and the secant method.

The secant method nevertheless converges more quickly than the linear method, taking half the number of iterations to reduce the output error power to 0.1 mwatt. Of more importance, though, is the fact that the same behaviour is obtained for every value of phase shift $\phi$, so that the PLL or phase shifter required by the linear method is made unnecessary.

In some cases, it may be advisable to modify the secant method by making smaller adjustments than those specified by (35). In so doing, one gains some reduction in adaptation jitter (see Section III(C) above), since the current value becomes a compromise, or approximate averaging, of a few of the most recent updates, rather than the single most recent update. The cost is reduced convergence and tracking speed. If we rearrange (35) as an explicit increment to $F_i$, and scale it, the modified iteration is:

$$F_i(k+1) = F_i(k) + \alpha \frac{e(k)(F_i(k-1) - F_i(k))}{e(k) - e(k-1)} \quad (36a)$$

where $\alpha$ is a step size parameter, normally no greater than 1 in magnitude. If $\alpha=1$, then (36a) reduces to (35).

The time required for initial convergence of the predistorter will now be estimated. Since each table entry needs about 10 iterations for convergence, the complete PD takes about 10 $N_t$ iterations. Assume that there is an iteration for each sample of the input. The required sampling rate for a signal of desired RF bandwidth W, and accurate representation of $n^{th}$ order intermod products, is nW (recall that these are complex samples). The time to converge is therefore approximately:

$$T_c = \frac{10\, N_t}{nW} \quad (37)$$

In particular, for 25 kHz channels and $7^{th}$ order products, and for a table of 64 entries, the convergence time is under 4 msec. Reconvergence time after a channel switch is even shorter, since the table is so small that values from the last use of the new channel can be loaded, and the PD resumes in a virtually converged state. These results represent a major improvement in speed compared with the 10 sec taken by the mapping PD with linear convergence.

The drawback of the method is its computational load. From (35), each iteration requires 2 complex additions, 4 complex multiplications, and 2 complex by real divisions. This is significantly more than in the linear convergence method. However, the load can be distributed by performing updates on only a decimated subsequence of input samples, with a corresponding increase in convergence time.

V. CONCLUSIONS

Like the mapping PD, the gain based PD of the present invention is applicable to any modulation format, and any AM/AM and AM/PM characteristic. However, it has major advantages compared with the mapping PD: it reduces memory requirements from 1 million complex word pairs to under 100 complex word pairs; it reduces convergence time with a new amplifier from 10 sec to about 4 msec; it reduces reconvergence time following a channel switch from 10 sec to virtually zero; and it removes the need for a phase shifter or PLL in the feedback path. On the other hand, the improvement is at the expense of increased computation, both in the real time multiplication of each sample by the complex gain, and in the adaptation update step.

Other significant findings from the analysis were as follows. Error in the PD table entries appears as a relative error in the gain based PD, compared with an absolute error in the mapping PD. The quantization error variance decreases as the inverse square of table size in the gain based PD, compared with a simple inverse in the mapping PD. Quantization error in the gain based PD, unlike the mapping PD, depends on the amplifier characteristic and on the instantaneous power level at the output; most error is contributed at levels near saturation, and near zero in the case of a Class AB amplifier.

The gain based predistorter of the present invention is well suited to DSP implementations of the next generation of spectrally efficient mobile communications equipment. Since it allows linearization of the power amplifier up to at least 95% of the saturated output power, it provides power efficiency as well as spectral efficiency.

As will be apparent to those skilled in the art in the light of the foregoing disclosure, many alterations and modifications are possible in the practice of this invention without departing from the spirit or scope thereof. For example, iteration algorithms which require less computation, but retain speed and independence of phase shift may be investigated. Accordingly, the scope of the invention is to be construed in accordance with the substance defined by the following claims.

I claim:

1. A method of linearizing an amplifier to produce an amplified output sample $v_a$ in response to a predistorted input sample $v_d$ derived from an input modulation sample $v_m$, such that $v_a \simeq Kv_m$, where K is the desired constant amplitude gain of said amplifier, said method comprising the steps of:

(a) deriving the squared magnitude $x_m$ of said input modulation sample $v_m$;

(b) selecting, from a table containing $N_t$ values $F_i$ where $i=0, 1, \ldots, N_t-1$, each of said entries corresponding to a squared magnitude values $x_{mi}$, and for each of which entries $F_i G(x_{mi}|F_i|^2) \simeq K$ where G(x) is the complex gain of said amplifier, a table entry $F_i$ for which $x_{mi}$ is: (i) the largest table entry less than or equal to $x_m$; or, (ii) the smallest table entry greater than or equal to $x_m$;

(c) deriving said predistorted sample $v_d$ as $v_d = v_m F_i$ in rectangular coordinates, viz:

$Re(v_d) = Re(v_m)Re(F_i) - Im(V_m)Im(F_i)$ $Im(v_d) = Re(v_m)Im(F_i) + Im(V_m)Re(F_i)$ where Re(x) is the real component of x and Im(x) is the imaginary component of x; and, (d) driving said amplifier with said predistorted input sample $v_d$.

2. A method as defined in claim 1, further comprising sequentially repeating each of said steps k times and, after each derivation of said predistorted sample $v_d(k)$, performing the further steps of:

(a) deriving a sample $v_a(k)$ of said amplifier's output;

(b) deriving an error sample $e(k) = -(v_a(k) - Kv_m(k))v_m^*(k)$ (c) deriving an adjusted value $F_i(k+1)$ of the table entry $F_i(k)$ selected during the $k^{th}$ selecting step, where:

$$F_i(k+1) = F_i(k) + \alpha \frac{e(k)(F_i(k-1) - F_i(k))}{e(k) - e(k-1)}$$

where $\alpha$ is an appropriately chosen constant;

(d) replacing said table entry $F_i(k)$ with said adjusted value $F_i(k+1)$; and, (e) sequentially repeating all of said steps.

3. A method of linearizing an amplifier to produce an amplified output sample $v_a(k)$ in response to a predistorted input sample $v_d(k)$ derived from an input modulation sample $v_m(k)$, such that $v_a(k) \simeq Kv_m(k)$, where K is the desired constant amplitude gain of said amplifier and k denotes the $k^{th}$ such samples, said method comprising the steps of:

(a) deriving the squared magnitude $x_m(k)$ of said input modulation sample $v_m(k)$;

(b) selecting, from a table of $N_t$ entitles $F_i$ where $i=0, 1, \ldots, N_t-1$, each of said entries containing a squared magnitude value $x_{mi}$, and for each of which entries $F_i G(x_{mi}|F_i|^2) \simeq K$ where G(x) is the complex gain of said amplifier, a table entry $F_i(x_m(k))$ for which $x_{mi}$ is:

(i) the largest table entry less than or equal to $x_m(k)$; or, (ii) the smallest table entry greater than or equal to $x_m(k)$;

(c) deriving said predistorted sample $v_d(k)$ as $v_d(k) = v_m(k)F_i(x_m(k))$ in rectangular coordinates, viz:

$Re(v_d(k)) = Re(v_m(k))Re(F_i(k)) - Im(v_m(k))Im(F_i(x_m(k)))$ $Im(v_d(k)) = Re(v_m(k))Im(F_i(x_m(k))) + Im(vhd\ m(k))Re(F_i(x_m(k)))$ where Re(x) is the real component of x and Im(x) is the imaginary component of x;

(d) driving said amplifier with said predetermined input sample $v_d(k)$;

(e) incrementing k by 1; and, (f) sequentially repeating steps (a) through (e).

4. A method of linearizing an amplifier to produce an amplified output sample $v_a(k)$ in response to a predistorted input sample $v_d(k)$ derived from an input modulation sample $v_m(k)$, such that $v_a(k) \simeq Kv_m(k)$, where K is the desired constant amplitude gain of said amplifier and k denotes the $k^{th}$ such sample, said method comprising the steps of:

(a) deriving the squared magnitude $x_m(k)$ of said input modulation sample $v_m(k)$;

(b) selecting, from a table of $N_t$ entries $F_i(k)$ where $i=0, 1, \ldots, N_t-1$, each of said entries containing a squared magnitude value $x_{mi}(k)$, and for each of which entries $F_i(k)G(x_{mi}(k)|F_i(k)|^2) \simeq K$ where G(x) is the complex gain of said amplifier, a table entry $F_i(k)$ for which $x_{mi}$ is:

(i) the largest table entry less than or equal to $x_m(k)$; or, (ii) the smallest table entry greater than or equal to $x_m(k)$;

(c) deriving said predistorted sample $v_d(k)$ as $v_d(k) = v_m(k)F_i(k)$ in rectangular coordinates, viz:

$Re(v_d(k)) = Re(v_m(k))Re(F_i(k)) - Im(V_m(k))Im(F_i(k))$ $Im(v_d(k)) = Re(v_m(k))Im(F_i(k)) + Im(V_m(K))Re(F_i(K))$ where Re(x) is the real component of x and Im(x) is the imaginary component of x;

(d) driving said amplifier with said predistorted input sample $v_d(k)$;

(e) deriving said amplified output sample $v_a(k)$;

(f) deriving an error sample $e(k) = -(v_a(k) - Kv_m(k))v_m^*(k)$;

(g) deriving an adjusted value Fhd i(k+1) of said selected table entry $F_i(k)$, where:

$$F_i(k+1) = F_i(k) + \alpha \frac{e(k)(F_i(k-1) - F_i(k))}{e(k) - e(k-1)}$$

where $\alpha$ is an appropriately chosen constant;

(h) replacing said table entry $F_i(k)$ with said adjusted value $F_i(k+1)$;

(i) incrementing k by 1; and, (j) sequentially repeating steps (a) through (i).

5. A method as defined in claim 1, wherein said selecting step further comprises selecting that table entry $F_i$ for which the absolute value $|x_m - x_{mi}|$ is minimized with respect to the table index i.

6. A method as defined in claim 3, wherein said selecting step further comprises selecting that table entry $F_i(x_m(k))$ for which the absolute value $|x_m - x_{mi}|$ is minimized with respect to the table index i.

7. A method as defined in claim 4, wherein said selecting step further comprises selecting that table entry $F_i(k)$ for which the absolute value $|x_m(k)-x_{mi}(k)|$ is minimized with respect to the table index i.

8. A method of linearizing an amplifier to produce an amplified output sample $v_a$ in response to a predistorted input sample $v_d$ derived from an input modulation sample $v_m$, such that $v_a \simeq K v_m$, where K is the desired constant amplitude gain of said amplifier, said method comprising the steps of:

(a) deriving the squared magnitude $x_m$ of said input modulation sample $v_m$;

(b) deriving, by interpolation on a table containing $N_t$ values $F_i$ where $i=0, 1, \ldots, N_t-1$, each of said entries corresponding to a squared magnitude value $x_{mi}$, and for each of which entries $F_i G(x_{mi}|F_i|^2) \simeq K$ where $G(x)$ is the complex gain of said amplifier, a value $F(x_m)$;

(c) deriving said predistorted sample $v_d$ as $v_d = v_m F(x_m)$ in rectangular coordinates, viz:

$$Re(v_d) = Re(v_m)Re(F(x_m)) - IM(V_m)Im(F(x_m))$$

$$Im(v_d) = Re(v_m)Im(F(x_m)) + Im(V_m)Re(F(x_m))$$

where Re (x) is the real component of x and Im(x) is the imaginary component of x; and, (d) driving said amplifier with said predistorted input sample $v_d$.

* * * * *